(12) United States Patent
Kapur et al.

(10) Patent No.: US 7,797,601 B2
(45) Date of Patent: Sep. 14, 2010

(54) SLACK-BASED TRANSITION-FAULT TESTING

(75) Inventors: Rohit Kapur, Cupertino, CA (US); Tom W. Williams, Boulder, CO (US); Cyrus Hay, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/469,820

(22) Filed: May 21, 2009

(65) Prior Publication Data

US 2009/0235133 A1    Sep. 17, 2009

Related U.S. Application Data

(63) Continuation of application No. 11/366,679, filed on Mar. 2, 2006, now Pat. No. 7,546,500.

(51) Int. Cl.
  G01R 31/28   (2006.01)
  G01R 31/30   (2006.01)
  G01R 31/26   (2006.01)
  G11B 20/20   (2006.01)
  G06F 9/45    (2006.01)

(52) U.S. Cl. .................. 714/726; 714/700; 714/724; 714/729; 714/741; 714/742; 714/745; 716/6; 324/765

(58) Field of Classification Search .......... 714/726, 714/700, 724, 729, 741, 742, 745; 716/6; 324/765
See application file for complete search history.

(56) References Cited

U.S. PATENT DOCUMENTS

| | | | |
|---|---|---|---|
| 5,596,585 A * | 1/1997 | Njinda et al. ............... 714/733 |
| 6,148,425 A | 11/2000 | Bhawmik | |
| 6,453,437 B1 * | 9/2002 | Kapur et al. ................ 714/741 |
| 6,708,139 B2 * | 3/2004 | Rearick et al. ............. 702/185 |
| 7,039,845 B2 * | 5/2006 | Rearick et al. ............. 714/738 |
| 7,089,143 B2 * | 8/2006 | Foreman et al. ............ 702/125 |
| 7,117,466 B2 * | 10/2006 | Kalafala et al. ................ 716/6 |
| 7,444,608 B2 * | 10/2008 | Foreman et al. ................ 716/6 |
| 7,555,689 B2 * | 6/2009 | Goswami et al. ........... 714/741 |
| 2003/0115526 A1 * | 6/2003 | Fetherson .................. 714/738 |
| 2003/0188246 A1 | 10/2003 | Rearick | |
| 2003/0204350 A1 | 10/2003 | Rearick | |
| 2004/0025123 A1 * | 2/2004 | Angilivelil ...................... 716/4 |
| 2004/0243339 A1 | 12/2004 | Maruyama | |
| 2005/0010839 A1 | 1/2005 | Takeoka | |
| 2005/0066242 A1 | 3/2005 | Wang | |
| 2005/0182587 A1 | 8/2005 | Sato | |
| 2005/0203716 A1 * | 9/2005 | Organ et al. ................ 702/185 |
| 2005/0225365 A1 * | 10/2005 | Wood .......................... 327/141 |
| 2005/0243869 A1 | 11/2005 | Hathaway | |

* cited by examiner

Primary Examiner—John J Tabone, Jr
(74) Attorney, Agent, or Firm—Park, Vaughan & Fleming LLP; Laxman Sahasrabuddhe

(57) ABSTRACT

A system that generates test patterns for detecting transition faults in an integrated circuit (IC). During operation, the system receives slack times for each net in the IC. Note that a slack time for a net is the minimum amount of delay that the given net can tolerate before violating a timing constraint. For each possible transition fault in the IC, the system uses the slack times for nets in the IC to generate a test pattern which exposes the transition fault by producing a transition that propagates along the longest path to the transition fault.

16 Claims, 13 Drawing Sheets

| DESIGN | PATH TYPE: | MAX CRPR ERR: % | AVER CRPR ERR: % | NUM PATHS: |
|---|---|---|---|---|
| D02 | MAX | 2017.0 | 151.8 | 21 |
| D03 | MAX | 5467.0 | 237.3 | 191 |
| D06 | MAX | 5.3 | 1.0 | 18 |
| D07 | MAX | 4.8 | 0.9 | 18 |
| D08 | MAX | 4.8 | 0.9 | 18 |
| D09 | MAX | 50.0 | 0.6 | 100 |
| D11 | MAX | 1.0 | 0.1 | 48 |
| D12 | MAX | 4.8 | 0.9 | 18 |
| D14 | MAX | 50.1 | 0.6 | 100 |
| D15 | MAX | 1.0 | 0.1 | 48 |

**FIG. 6
PRIOR ART**

SLACK-BASED TRANSITION-FAULT TESTING

RELATED APPLICATION

This application is a continuation application of U.S. application Ser. No. 11/366,679, entitled "Slack-Based Transition-Fault Testing," by inventors Rohit Kapur, Tom W. Williams, and Cyrus Hay, filed on 2 Mar. 2006, now U.S. Pat. No. 7,546,500.

BACKGROUND

1. Field of the Invention

The present invention relates to techniques for testing semiconductor chips. More specifically, the present invention relates to a method and apparatus for generating tests for transition-fault testing of semiconductor chips.

2. Related Art

Advances in semiconductor technology presently make it possible to integrate large-scale systems, including tens of millions of transistors, onto a single semiconductor chip. These advances also allow a semiconductor chip to operate at higher clock frequencies. Unfortunately, these advances are also making it more difficult to meet timing constraints because of the shorter clock cycle times and longer wire delays. Although a semiconductor chip may meet timing constraints during the design phase, a manufactured semiconductor chip may contain defects, due to process variations, which cause the chip to fail. Hence, prior to shipping semiconductor chips to customers, the semiconductor chips are tested to separate defective chips from non-defective chips.

Present semiconductor testing techniques typically utilize stuck-at fault testing, which generates test vectors and expected test values based on the assumption that a net within the semiconductor chip is stuck at either the power supply or at ground. Although CMOS circuits are not well represented by stuck-at faults, stuck-at fault testing has been effective in ensuring that the physical structure of the semiconductor chip is covered by the resulting test set. Unfortunately, timing-related defects, such as path delay faults and transition faults, remain uncovered.

For typical semiconductor chip designs, generating test patterns to detect path delay faults is intractable because of the large number of paths that need to be covered. Thus, transition fault testing is the only tractable solution available to detect timing failures.

Automatic test pattern generation (ATPG) techniques obtain their efficiency by targeting the easiest solutions first. For transition faults, this means that the transition faults are detected along shorter paths (i.e. the paths with a larger slack time). Note that a slack time for a net is the minimum amount of delay that the given net can tolerate before violating a timing constraint. Fault simulation adds to the efficiency of the test generation process by taking credit for transition faults that are randomly detected by the tests generated for the targeted fault. These transition faults are usually detected along paths with slacks that are random with respect to all the paths on which the transition faults can be detected.

Transition fault tests catch timing failures that exceed the timing of the test. FIG. 1 illustrates the timing of paths along which a transition fault can be tested. In FIG. 1, a test is applied at t=0 to expose timing failures and is measured one clock period later (at $T_{MC}$). In this case, $T_{TEST}$ and $T_{MC}$ are the same. Note that $T_{MC}$ is the machine cycle time (i.e. the clock speed at which the semiconductor chip operates at during normal operation) and $T_{TEST}$ is the time when the test measurement is made. In this example, Path A, represents a test for a transition fault along its longest path (i.e. a path with the minimum slack). Path B represents a test for the same transition fault along a shorter path (i.e. a path with a larger slack time). The smallest timing defect that can be detected by a test is equal to the slack of the path on which the fault was tested. Since the slack along Path A ($S_{LP}$) is less than the slack along Path B ($S_{SP}$), the test along Path A is better than the test along Path B for detecting small-delay timing defects.

Since test generation is an NP-Complete problem and heuristics are used to guide the test generator to the quickest solution, Path B is only one of the short paths of the many possible short paths that exist for the targeted transition fault. A typical ATPG tool produces a path similar to Path B (i.e. a shorter path).

The relationship between slack and the defect level is quantified in the following equation:

$$DL = 1 - Y^{(1-SDFC)}$$

The defect level (DL) is a function of the yield Y and statistical delay fault coverage (SDFC), which represents the defect coverage equivalent for the path length along which the test occurs. A fault detected along the shorter path contributes approximately $(T_{MC}-S_{SP})/(T_{MC}-S_{LP})$ towards SDFC which is the average over all the faults/defects in the design.

Two techniques are used to generate test patterns for detecting transition faults:
1. Binning
2. Long path ATPG Binning brings the test time ($T_{TEST}$) closer to the shorter path which was generated by the ATPG tool, thereby reducing the slack for this shorter path. In contrast, long path ATPG selects the path closer to the $T_{MC}$.

Unfortunately, bringing in $T_{TEST}$ tighter than the machine time ($T_{MC}$) to get better quality transition fault tests causes problems for which there are no solutions. When $T_{TEST}$ is brought in relative to $T_{MC}$, all flip-flops that do not meet the new timing need to be masked to ignore the value captured in them. While this is possible for a good machine (i.e. non-defective chip), it is an intractable problem for a faulty machine (i.e. defective chip). The masking of the flip-flops that do not meet the new timing accounts for signals propagating along the longest path, which cannot reach the destination flip-flops within the shortened test time ($T_{TEST}<T_{MC}$). In a system where the clock cycle time is $T_{MC}$, these flip-flops receive the correct values (assuming that there are no defects). If these flip-flops are not masked during testing, the semiconductor chip appears to be defective when in fact the chip is still operational.

FIG. 2 illustrates the effect of tightening the test time relative to the machine clock cycle. In this example, $T_{TEST}$ occurs before $T_{MC}$, thereby making the slack of Path B smaller than the slack of the Path A in relation to the machine cycle time ($S_{SP}<S_{LP}$). In a non-defective (i.e. good) semiconductor chip, timing defects smaller than $S_{LP}$ do not cause a failure, but since $T_{TEST}$ occurs before a signal traversing along on Path A has settled, the test may indicate that the semiconductor chip is defective. Thus, a good semiconductor chip could be marked as being defective if the captured value is not ignored for the test, resulting in a yield loss because the non-defective chip is incorrectly marked as defective. This yield loss is unavoidable; hence, binning is not an ideal solution for production testing for small delays.

Long path ATPG is another solution for small-delay testing. Long path ATPG requires a guidance mechanism that allows the test generator to make choices which lead to the creation of a test for the transition fault which is exposed by paths with the smallest possible slack. The natural guidance mechanisms are the arrival time and required time values.

SCOAP and Slack Based ATPG

ATPG techniques take a target fault and systematically exhaust the test search space of inputs and scan flip-flops to generate a test pattern for the fault. ATPG starts from the fault site, obtains a difference "D", between the good machine and faulty machine and drives the difference to an observable point (i.e. a scan flip-flop or an output). During each step of the process, the ATPG tool makes decisions among the many possible choices available during the traversal of the design. Sandia Controllability/Observability Analysis Program (SCOAP) has been the traditional guidance mechanism which guides ATPG to make decisions such that fewer decisions need to be made to create a test for a given fault.

The efficiency of the transition fault model lies in the fact that it assumes a lumped delay at the fault site. Any path which can expose the fault at the fault site, regardless of the slack time for the path, can be used to detect the fault. In contract, the selection of a path with the smallest slack time possible requires the generation of test patterns for the fault site to be tied to an ordered list of patterns that pass through the fault site. The ordered list of paths is ordered from the path with the smallest slack to the path with the largest slack.

Long path ATPG requires a guidance mechanism to help generate a test which exposes the fault along the path with the least slack from the fault site to an observable point (scan flip-flop or output), and from the fault site to an input (or scan flip-flop). If the path with the least slack is not testable the next path with a larger slack is tried. Thus, ATPG needs to be guided by the arrival and required times (generated from static timing analysis) in the forward direction and reverse direction for the fault effects, and by the traditional SCOAP numbers for justification of off-path values where the length of the path is not relevant.

FIGS. 3A and 3B illustrate the results of the arrival time and required time calculations generated from a timing analysis tool. FIGS. 3A and 3B conceptually show arrival time and required time numbers as (-,-) to depict minimum and maximum values, respectively. In a levelized design, the arrival time is computed in a forward pass of the static timing analysis tool. A minimum and maximum arrival time is propagated for every node in the design. In a levelized design, minimum and maximum required times are computed in the reverse direction. The difference between the minimum of the required time and the maximum of the arrival time at any given net is the slack for that net for setup time (i.e. the longest path). The difference between the maximum of the required time and the minimum of the arrival time gives the slack for hold time (i.e. the shortest path).

Setup: Slack=$R_{MIN}-A_{MAX}$

Hold: Slack=$R_{MAX}-A_{MIN}$

Arrival Time Inaccuracy

FIG. 4 illustrates a common clock path. The setup time constraint (i.e. the long path) for the capturing flip-flop is computed as a difference between the maximum arrival time from the launch path of the data (max path 402) and the minimum arrival time from the clock path of the capturing flip-flop (min path 404). In other words the required time on the data path comes from the arrival times of the clock path at the capturing flip-flop.

The two paths that are combined to obtain the slack at the capturing flip-flop have common logic in the clock path. For this common logic, a maximum time is considered along one path and the minimum time is considered along the other path. A given path cannot be at its maximum and minimum times simultaneously. The difference between the maximum and minimum values of the delays along the common portion of the clock path leads to pessimism in the slack calculations. While the launching and capturing transitions are not propagated in the same clock period, they are one or at most few clock periods apart. The largest delay variations are not caused by any effects that change within a few clock periods. For the purposes of transition fault testing, the error due to common clock pessimism exists.

FIG. 5 illustrates the effect of clock network pessimism. It contains clock signal 502, a plurality of gates, and flip-flops 1-3. The minimum and maximum delays of the logic are shown in parentheses above each primitive (min, max). The combinational gates have a shortest delay of 1 time unit and a longest delay of 6 time units (1, 6). The FF1 has a clock-to-Q delay of (1, 2), FF2 has a setup constraint of (3, 4). Note that FF3 has a setup constraint of (0, 2). Also note that the nets have no delay (0, 0).

If T is the clock period, the slack time on FF2 without clock network pessimism is T+1+1-(6+6+6+2+4)=T-22 time units. When the overlap of the clock network is considered, (6+6)-(1+1)=10 time units, the slack time is T-12 time units. The timing slack for FF3 without clock network pessimism is T+1-(6+6+6+2+2)=T-21 time units. Clock network pessimism is 6-1=5 time units in this case. With this correction, the slack for FF3 is T-16 time units. Note that the critical path (i.e. the longest path) without any correction for clock network pessimism is from FF1 to FF2. With clock pessimism removed, the critical path is from FF1 to FF3. In deep submicron semiconductor processes, the clock networks are longer to accommodate larger chips. Hence, clock network delay plays a significant role in the slack calculations.

FIG. 6 illustrates the impact of common clock path pessimism on the slack computations. This impact is so significant that it cannot be ignored. In fact, common clock path pessimism contributes so much to the slack calculations that arrival time and required time numbers lead to incorrect identification of paths with minimum slack if common clock path pessimism is not taken into account. Unfortunately, present techniques for generating slack times for delay fault testing do not account for common clock path pessimism. Thus, the longest path that exposes a delay fault at the fault site may be incorrectly identified.

Furthermore, the amount of clock path pessimism for a given slack number is path dependent because the common clock network can only be determined once a path is established. Hence, ATPG for small-delay testing needs to try every possible launch-capture scenario for every decision point to determine the slack numbers for a path that exposes the fault and propagates the fault effect to an observable point.

As a result of the above-described problems, present techniques for precise small-delay transition fault testing are not practical. Even if accurate tests for transition faults are generated which exposes a transition fault along the path with the least slack, other faults that are fortuitously detected cannot be dropped during fault simulation. The random nature of fault detection makes the probability very low that a fault which is dropped in non-small-delay transition mode is detected along a path with the least slack. Note that without the use of fault dropping, test pattern inflation and excessive runtimes for test pattern generation results.

Hence, what is needed is a method and an apparatus for generating test patterns for small-delay defect testing of semiconductor chips without the problems described above.

SUMMARY

One embodiment of the present invention provides a system that generates test patterns for detecting transition faults in an integrated circuit (IC). During operation, the system receives slack times for nets in the IC. Note that a slack time for a given net is the minimum amount of delay that the given net can tolerate before violating a timing constraint. For each transition fault to be monitored in the IC, the system uses the slack times for the nets in the IC to generate a test pattern which exposes the transition fault by producing a transition that propagates along the longest path to the transition fault.

In a variation on this embodiment, prior to receiving slack times for each net in the IC, the system generates pin-to-pin delays for each net in the IC. The system then calculates slack times for each net in the IC using the pin-to-pin delays.

In a variation on this embodiment, while using the slack times for nets to generate the test pattern, for a gate whose output is coupled to the net being analyzed for the transition fault, the system selects an input of the gate with the smallest slack time for a transition at the input of the gate which exposes the transition fault at the output of the gate. Until a flip-flop or an input to the IC is reached, the system recursively selects the input of a current gate with the smallest slack time for a transition at the input of the current gate which exposes the transition fault. Note that the output of the current gate is coupled to a selected input of a previous gate. For each output path of the gate coupled to the net containing the transition fault, until a flip-flop or an output to the IC is reached, the system recursively selects the output path of the current gate with the smallest slack time for the transition at the output of the gate corresponding to the transition at the net containing the fault. Note that the input of the current gate is coupled to a selected output path of the previous gate.

In a variation on this embodiment, if a test pattern cannot be generated for the longest path for the transition fault, for each source flip-flop or input to the IC which does not produce a transition for a given test pattern, the system discards the slack times for the outputs of gates coupled to the source flip-flop. For each gate coupled to the output of a source flip-flop or an input to the IC, the system propagates to the output of the gate the slack times for the input of the gate which has the smallest slack time, relative to the other inputs of the gate. The system then uses the newly propagated slack times to generate the test pattern which produces a transition that propagates along the longest path that can be generated to the transition fault.

In a variation on this embodiment, the system selects a transition fault on a fanout a path of a source flip-flop which does not already contain a test pattern. Next, the system generates a test pattern which exposes the transition fault by producing a transition that propagates along the longest path to the transition fault. The system then selects values to fill "don't care" values to generate a substantially maximum number of the remaining transition faults to be monitored.

In a variation on this embodiment, the system fault-simulates the test pattern to determine which transition faults are detected.

In a variation on this embodiment, while fault-simulating the test pattern, for each gate, the system calculates a delta for each input of the gate by summing the slack time for a transition at the input of the gate which exposes the transition fault, with the existing delta for the input. The delta represents the time of the path along which a transition propagated, relative to the longest path through the associated node. This calculation starts from the source flip-flops. Note that the delta for a net directly coupled to a source flip-flop or to an input of the IC is zero. Next, the system selects the input of the gate with a transition occurring in the associated test with the smallest delta. The system then calculates a control delta slack for the output of the gate by summing the existing slack for the selected input with the difference between the slack time for a transition at the selected input of the gate which exposes the transition fault, and the smallest slack time for a transition at the inputs of the gate which exposes the transition fault.

In a variation on this embodiment, for each net within an output cone of the transition fault, the system calculates the difference between the slack time for the transition which is caused by the test pattern and the smallest slack time for a path within the output cone to produce a observe delta slack for the net.

In a variation on this embodiment, the system sums the control delta slack and the observe delta slack at each destination flip-flop or each output of the IC to produce a total delta slack value at the destination flip-flop. Next, the system compares the total delta slack values at destination flip-flops or outputs of the IC to a user specified delta slack value. If the total delta slack value at a given destination flip-flop or a given output of the IC is less than a user supplied delta slack value, the system gives credit to the given destination flip-flop or the given output of the IC for detecting the transition fault. The system then determines if other transition faults are detected with the test pattern within the user supplied delta slack value.

In a variation on this embodiment, if a test pattern generates a glitch on a given net and if the glitch is above a minimum glitch size, the system treats the glitch as a valid transition.

BRIEF DESCRIPTION OF THE FIGURES

FIG. 6 illustrates the impact of common clock path pessimism on slack time computations.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs).

ASIC Design Flow

Figure 10:
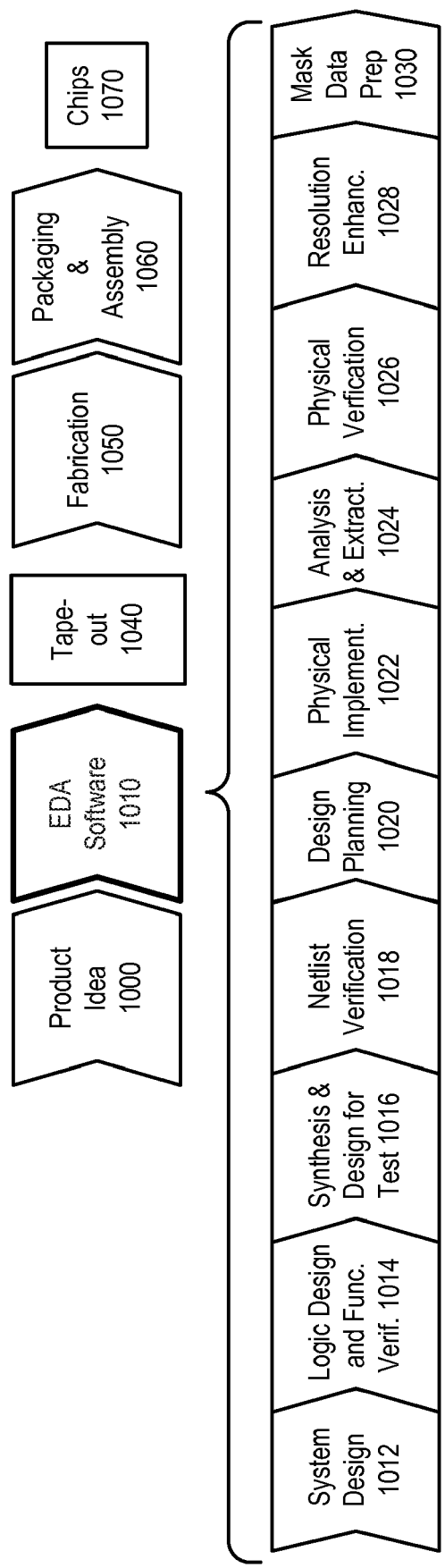
FIG. 10 shows a simplified representation of an exemplary digital ASIC design flow.

Before proceeding further with the description, it may be helpful to place this process in context. FIG. 10 shows a simplified representation of an exemplary digital ASIC design flow. At a high level, the process starts with the product idea (step 1000) and is realized in an EDA software design process (step 1010). When the design is finalized, it can be taped-out (event 1040). After tape out, the fabrication process (step 1050) and packaging and assembly processes (step 1060) occur resulting, ultimately, in finished chips (result 1070).

The EDA software design process (step 1010) is actually composed of a number of steps 1012-1030, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 1010) will now be provided:

System design (step 1012): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 1014): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 1016): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compile®, Physical Compiler, Test Compiler, Power Compiler, FPGA Compiler, Tetramax, and DesignWare® products. The present invention is directed to the design for test step of the ASIC design flow.

Netlist verification (step 1018): At this step, the netlist is checked for compliance with timing constraints and for correspondence with the VHDL % Verilog source code. Exemplary EDA software products from Synopsys, Inc. that can be used at this step include Formality, PrimeTime, and VCS products.

Design planning (step 1020): Here, an overall floorplan for the chip is constructed and analyzed for timing and top-level routing. Exemplary EDA software products from Synopsys, Inc. that can be used at this step include Astro and IC Compiler products.

Physical implementation (step 1022): The placement (positioning of circuit elements) and routing (connection of the same) occurs at this step. Exemplary EDA software products from Synopsys, Inc. that can be used at this step include the Astro and IC Compiler products.

Analysis and extraction (step 1024): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 1026): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 1028): This step involves geometric manipulations of the layout to improve manufacturability of the design. Exemplary EDA software products from Synopsys, Inc. that can be used at this step include Proteus, ProteusAF, and PSMGen products.

Mask data preparation (step 1030): This step provides the "tape-out" data for production of masks for lithographic use to produce finished chips. Exemplary EDA software products from Synopsys, Inc. that can be used at this step include the CATS® family of products.

Generating a Test Pattern Along the Longest Path

The goal of long-path ATPG is to generate tests for transition faults along the path with the minimum slack. One embodiment of the present invention uses the arrival and required times for every node generated by a static timing analysis tool that accounts for common clock paths. The resulting per-node slack time values are used to guide the ATPG tool to obtain the difference along a long path and to propagate fault effects along the long path.

Figure 8A:
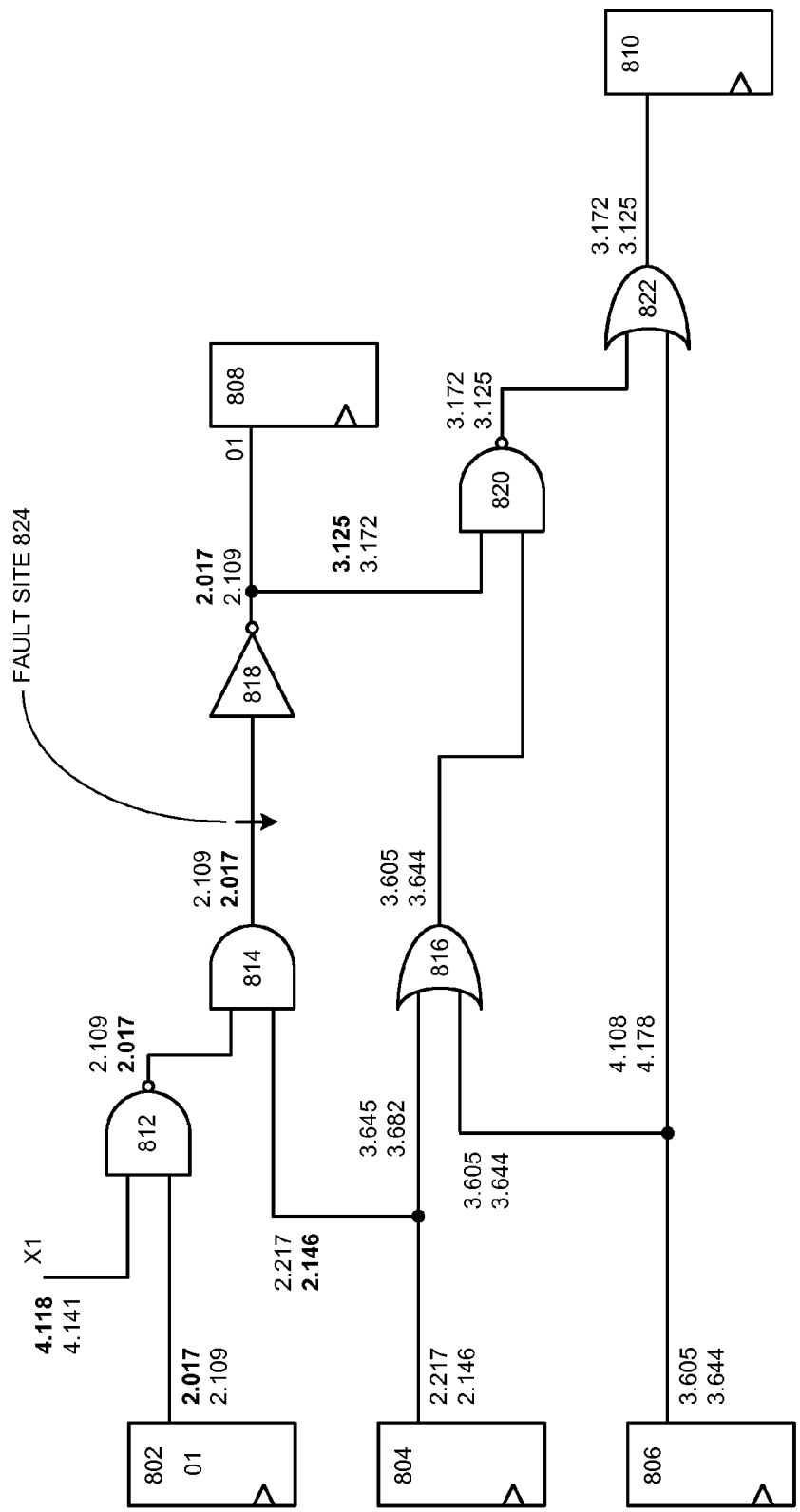
FIG. 8A illustrates the process of generating a test pattern to detect transition faults along a path with the smallest slack time in accordance with an embodiment of the present invention.

FIG. 8A illustrates the process of generating a test pattern to detect transition faults along a path with the smallest slack time in accordance with an embodiment of the present invention. It contains flip-flops 802-810, NAND gates 812 and 820, AND gate 814, OR gates 816 and 822, and inverter 818. The process begins by starting at fault site 824 and selecting an input of a gate which has the smallest slack for the given transition which exposes the fault being tested at fault site 824. In this example, a slow-to-fall transition fault is being considered at fault site 824.

The top input of AND gate 814 has the smallest slack (2.017 versus 2.146) for a low-going transition which can produce a low-going transition at fault site 824. Therefore, the top input to AND gate 814 (the output of NAND gate 812) is selected.

In order to generate a low-going transition at the output of NAND gate 812, both inputs of NAND gate 812 must be set to 1, and at least one input of NAND gate 812 must have been previously set to a 0. The bottom input to NAND gate 812 has the smallest slack time (2.017 versus 4.118), thus it is selected. Hence, a test pattern at flip-flop 802 is 01 (a 0 followed by a 1). The top input for NAND gate 812 is set to X1 (a "don't care," followed by a 1). The don't care value is set later in the test pattern generation process such that the maximum number of the remaining transition faults is monitored.

After reaching a source flip-flop (i.e. any of flip-flops 802, 804, and 806), the process continues going forward from fault site 824 until a destination flip-flop (i.e. either flip-flop 808 or 810) is reached. Again, the path with the smallest slack is chosen. For example, the output of inverter 818 fans out into two branches, each with different slack times. Since the test pattern is testing for a low-going transition fault at fault site 824, the output of inverter 818 is a high-going transition. Thus, the path going to flip-flop 808 is chosen since the slack time for that path is 2.017, compared to the other path, which has a slack time of 3.125.

After populating flip-flops with test patterns to detect the targeted transition fault, some test patterns may produce no transitions. For example, a test pattern of 00 or 11 produces no transition at a given flip-flop. If the non-transitioning node has a smaller slack than another input to a gate coupled to that non-transitioning node, the non-transitioning node will be selected by the ATPG engine. Note that the correct behavior for the ATPG engine is to select an input which can produce a transition (given existing test patterns generated for other transition faults).

Figure 8B:
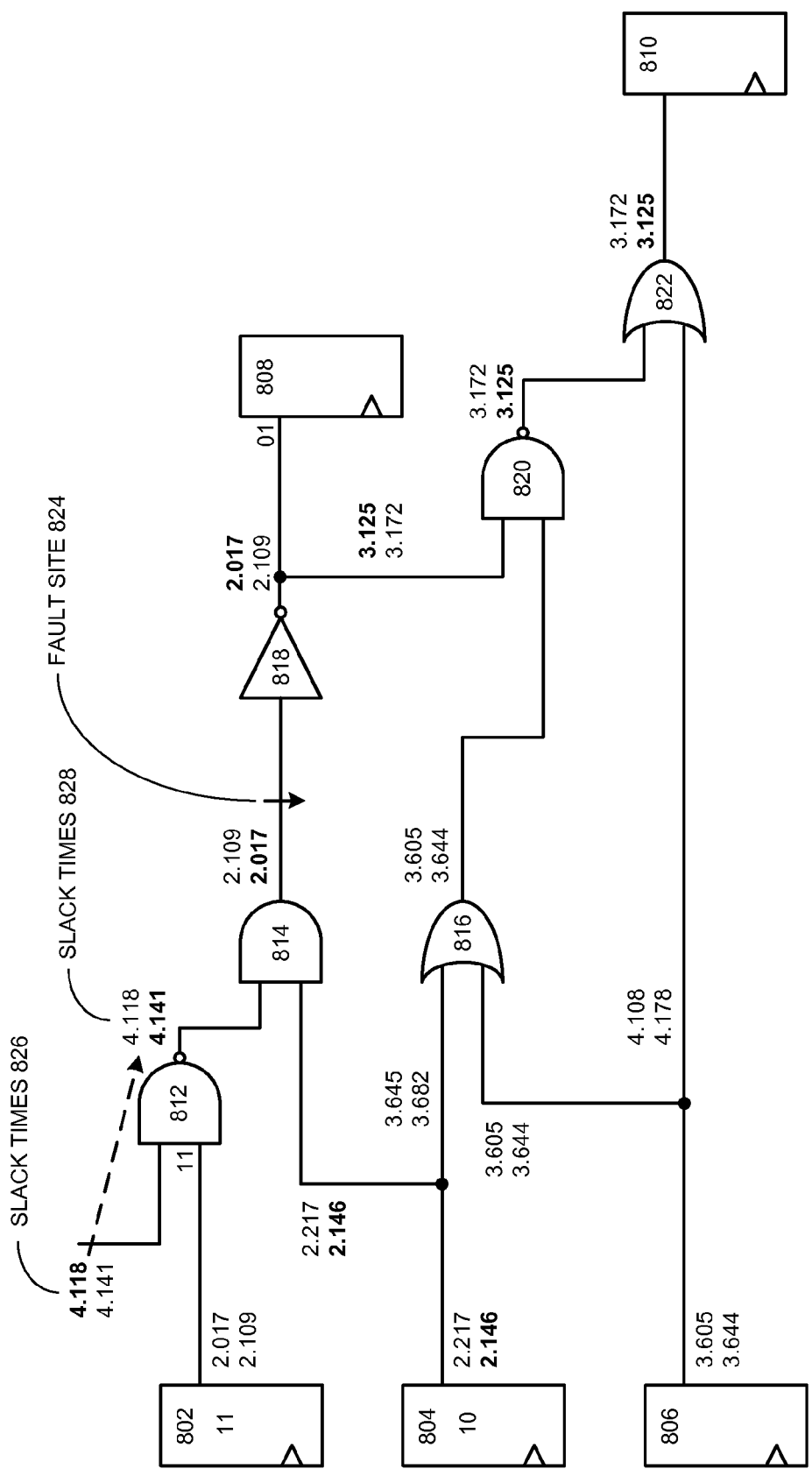
FIG. 8B illustrates the process of generating a test pattern to detect transition faults along a path with the next smallest slack time in accordance with an embodiment of the present invention.

FIG. 8B illustrates the process of generating a test pattern to detect transition faults along a path with the next smallest slack time in accordance with an embodiment of the present invention. In this example, the test pattern 11 is assigned to flip-flop 802, thus the bottom input to NAND gate 812 does not transition. Hence, when searching for the longest path, with a simple comparison of the slack values as explained the ATPG engine incorrectly selects the top input of NAND gate 812 when it should have selected the bottom input of AND gate 814.

To guide the ATPG engine to search for the next longest path, outputs of flip-flops that do not transition are removed from the search process. In this example, the slack times for the output of flip-flop 802 are removed by "implying" the slack times of the top input of NAND gate 812 (slack times 826) to the output of NAND gate 812 (slack times 828). In other words, the slack values associated with the output of NAND gate 812 are modified. Thus, when the ATPG engine selects the input of AND gate 814 with the smallest slack time, it selects the bottom input of AND gate 814 (2.146 versus 4.141).

ATPG Dial Solution

Given the complications in arrival time and required time computations, which include effects such as process variations and statistical delay calculations for signal integrity, in one embodiment of the present invention, the ATPG engine uses slack times generated by a static timing analysis tool which accounts for common clock path pessimism. The ATPG engine uses the slack times along with SCOAP numbers to guide the creation of tests which expose faults along paths that have less slack.

In one embodiment of the present invention, pattern inflation and runtime issues are limited by providing a user with a dial that determines the percentage of faults that are targeted by ATPG versus the percentage of faults that are allowed to be fortuitously dropped with fault simulation.

Long_Path=<0 . . . 100>

Note that if 0% of the faults need to be tested along the longest path, the typical transition fault test set is created. If 100% of the faults need to be tested using test patterns that expose the fault along the longest path, ATPG is invoked for every fault to target the longest possible path. This is true regardless of the classification of the fault as a primary or secondary fault in the ATPG process.

Note that fault simulation maintains different detection accounting for the ATPG generated faults and the faults detected by fault simulation.

There are a few special cases to the test generation process:
1. Fault simulation reaches the (100-Long_Path) percentage before ATPG reaches the Long_Path percentage. In this case, fault simulation continues taking credit for fortuitous detection of faults. To achieve its goal, the ATPG process then continues by picking faults that were not targeted by ATPG. The priority of picking the faults is (1) undetected faults, and (2) fortuitously-detected faults.
2. ATPG reaches the (Long_Path) percentage before adequate transition faults are detected. In this case, ATPG continues generating tests which expose faults along the long paths. The Long_Path percentage represents a minimum required detection threshold along the long paths. Fault detection credit can be upgraded accordingly from the fortuitous detection category to the Long_Path category.

In one embodiment of the present invention, a special parameter guides the ATPG tool to provide a solution where all transition faults with the right polarity are considered detected if they lie on the critical path of the targeted transition fault.

Fault Simulation Dial Solution

In one embodiment of the present invention, a fault simulation dial solution is provided. A fault simulation dial solution requires the same ATPG support as the ATPG dial solution (but without an ATPG dial). In this case ATPG always generates a test pattern which exposes the fault along the longest path whenever ATPG is invoked. Faults are given detection credit in two categories based upon the following parameter, which represent a contiguous time interval that ends on the longest path time for a given fault. This absolute time represented by this interval is fault dependant.

delta_slack=<time_integer ps>

In one embodiment of the present invention, fault simulation takes credit for faults that are detected with a certain amount of delta_slack from the path with the smallest slack for the fault. Faults are given detection credit in two categories, ones that meet the delta_slack and those that do not. Detection credit can be upgraded from the category that does not meet the slack timing to the category where the delta_slack is met. In other words, faults can only be dropped when the delta_slack category is met. Note that no effort is made to improve the slack of a detected fault that already meets the dialed time.

Figure 1:
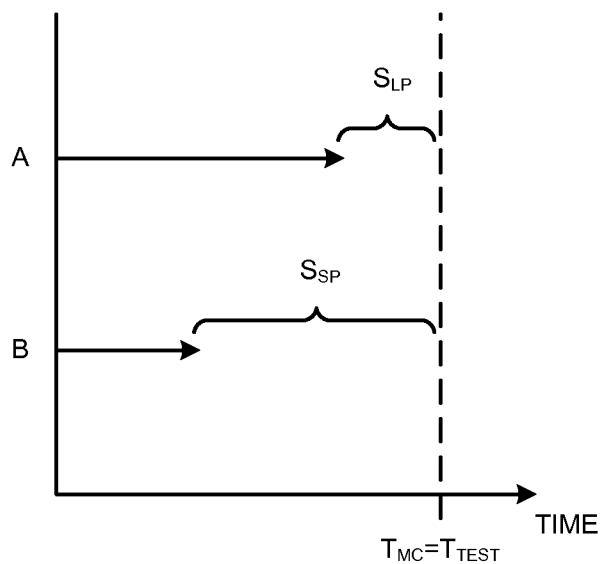
FIG. 1 illustrates the timing of paths along which a transition fault can be tested.
Figure 2:
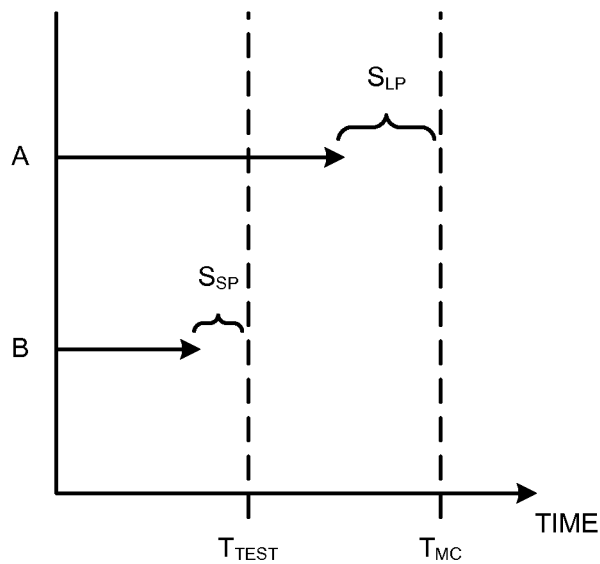
FIG. 2 illustrates the effect of tightening the test time relative to the machine clock cycle.
Figure 3A:
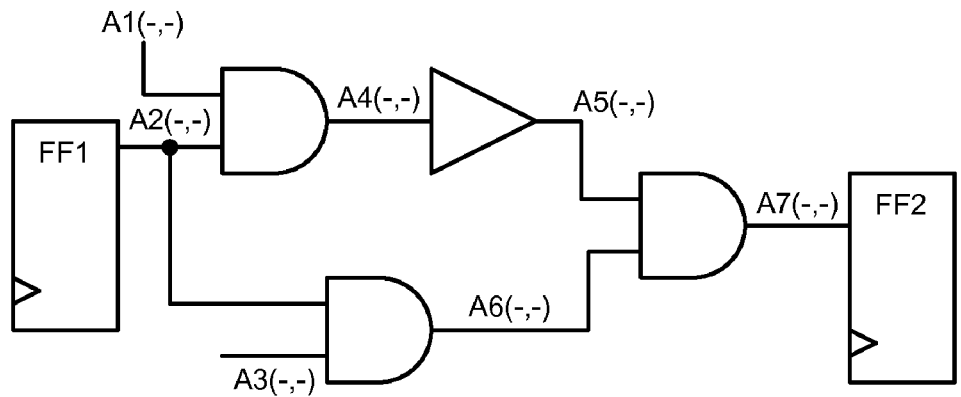
FIG. 3A illustrates the results of the arrival time calculation generated from a timing analysis tool.
Figure 3B:
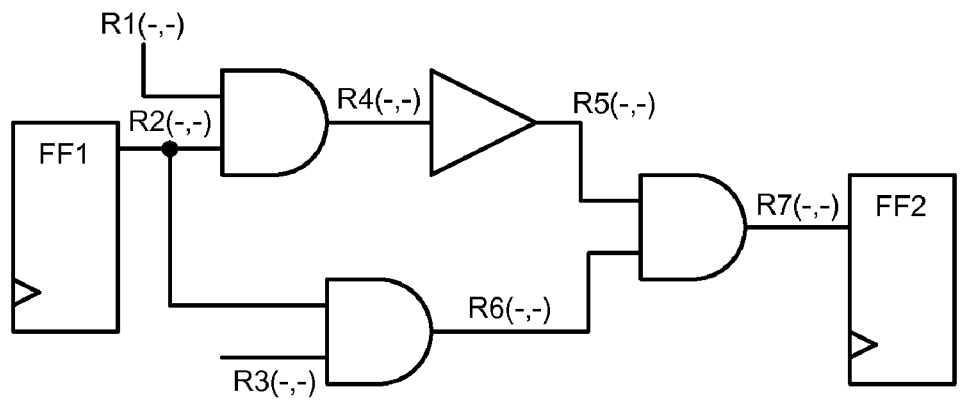
FIG. 3B illustrates the results of the required time calculation generated from a timing analysis tool.
Figure 4:
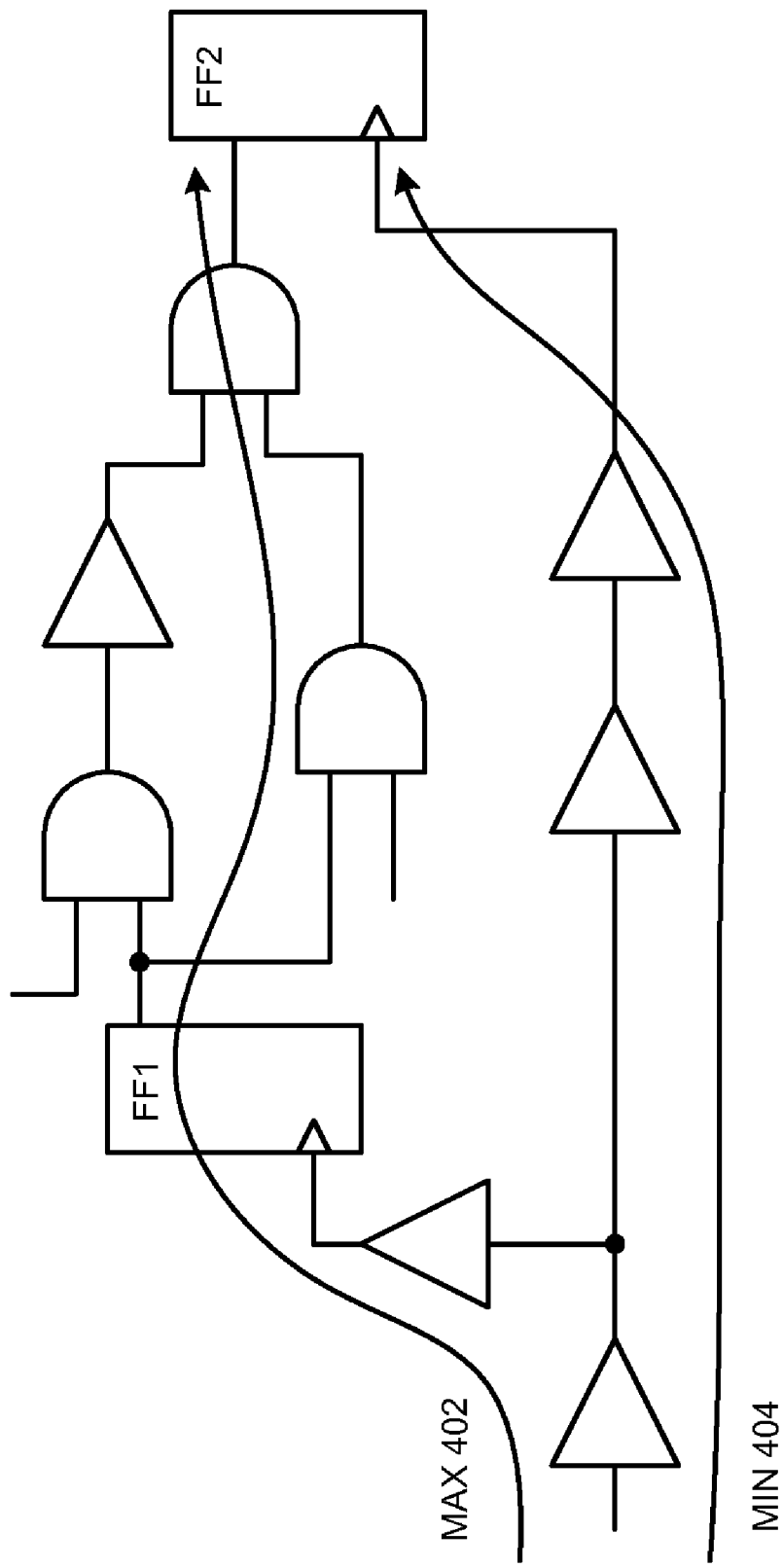
FIG. 4 illustrates a common clock path.
Figure 5:
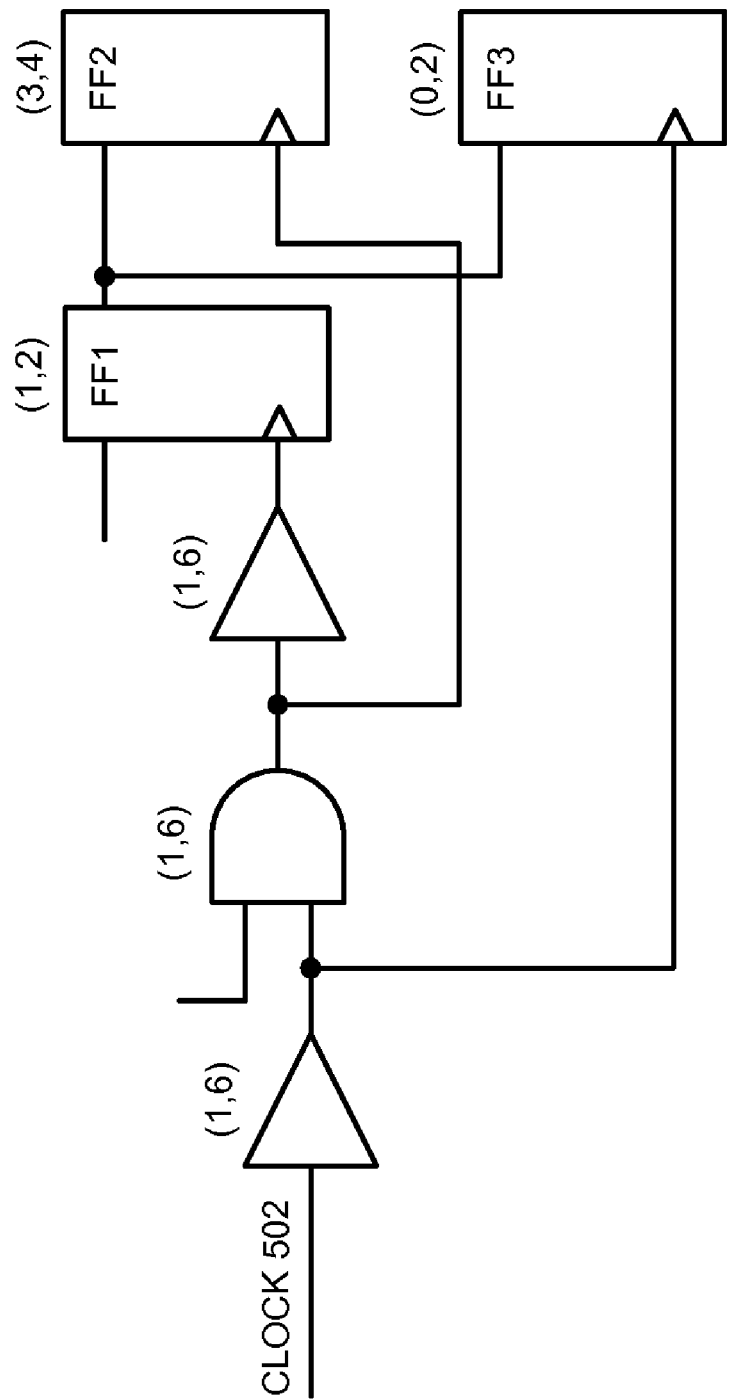
FIG. 5 illustrates the effect of clock network pessimism.
Figure 7:
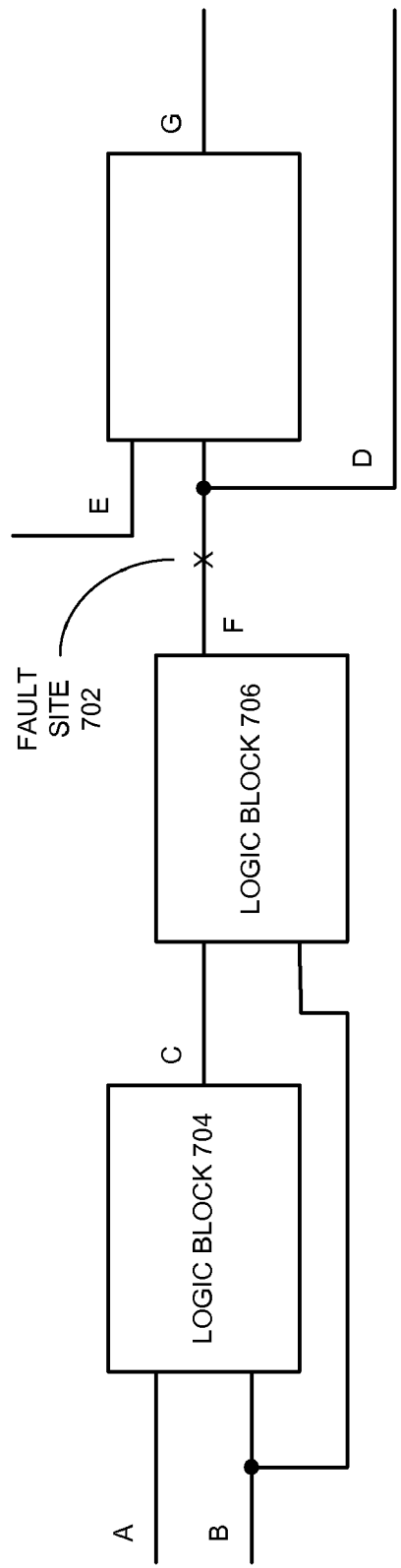
FIG. 7 presents a block diagram of a circuit with slack numbers in accordance with an embodiment of the present invention.

FIG. 7 presents a block diagram of a circuit with slack numbers in accordance with an embodiment of the present invention. The blocks in FIG. 7 represent a network of combinational AND-gates. The slack times for each node in FIG. 7 are as follows: a=2, b=3, c=2, f=2, e=4, d=4, and g=2. In FIG. 7, ATPG generates the test patterns a=11; b=01; e=00; for the fault marked x (fault site 702). During "good machine" simulation, control_delta_slack (Δc) is computed for nets where a transition is propagating. control_delta_slack represents the difference between the slack of the transitioning node to the slack along the longest path at that node. This control_delta_slack is propagated forward.

Note that since a does not transition for the test pattern (i.e. a 1 followed by a 1), the control_delta_slack is not applicable (N/A). Since b is the input which causes a transition that can expose the fault at fault site 702, the control_delta_slack is computed using the slack time for b. The control_delta_slack for b is 0 since inputs or flip-flop outputs have zero delta slacks.

Since the logic block 704 is an AND gate the transition at b appears at c. The control_delta_slack at c is computed as the existing control_delta_slack on b (i.e. 0), added to the difference between the slack for b and the smallest slack for all of the inputs of logic block 704 (i.e. the slack for a). Hence, control_delta_slack for c is 1.

To compute the control_delta_slack at f, a decision must be made as to which input to logic block 706, b or c, has the smallest slack. In order to determine which input has the smallest slack, the control_delta_slack of the input is added to the slack for that input. Hence, the delta slack for input c ($\Delta_1$) is 1+2=3 and the delta slack for input b ($\Delta_2$) is 0+3=3. In this case, both inputs of logic block 706 produce the same delta slacks and either input can be used to calculate the control_delta_slack at f. If input c is chosen, the control_delta_slack at f is 1+(2−2)=1. If input b is chosen, the control_delta_slack at f is 0+(3−2)=1. Thus, the control_delta_slacks are as follows: b=0; c=1; f=1; d=1.

For, each fault that is active, observe_delta_slack is computed in the forward cone from the fault site. observe_delta_slack represents the observation delta slack from the longest path. It is computed as a difference between the path on which the fault is detected and the longest path in the cone of the fault. The observe_delta_slack at d=2. Thus, the total delta_slack for the fault at d is 3. The total delta_slack is computed by the addition of the control_delta_slack at f and the observe_delta_slack for the fault detection at d. This total delta_slack number is compared with the delta_slack provided by user to determine if the test pattern detects the transition fault.

Figure 9A:
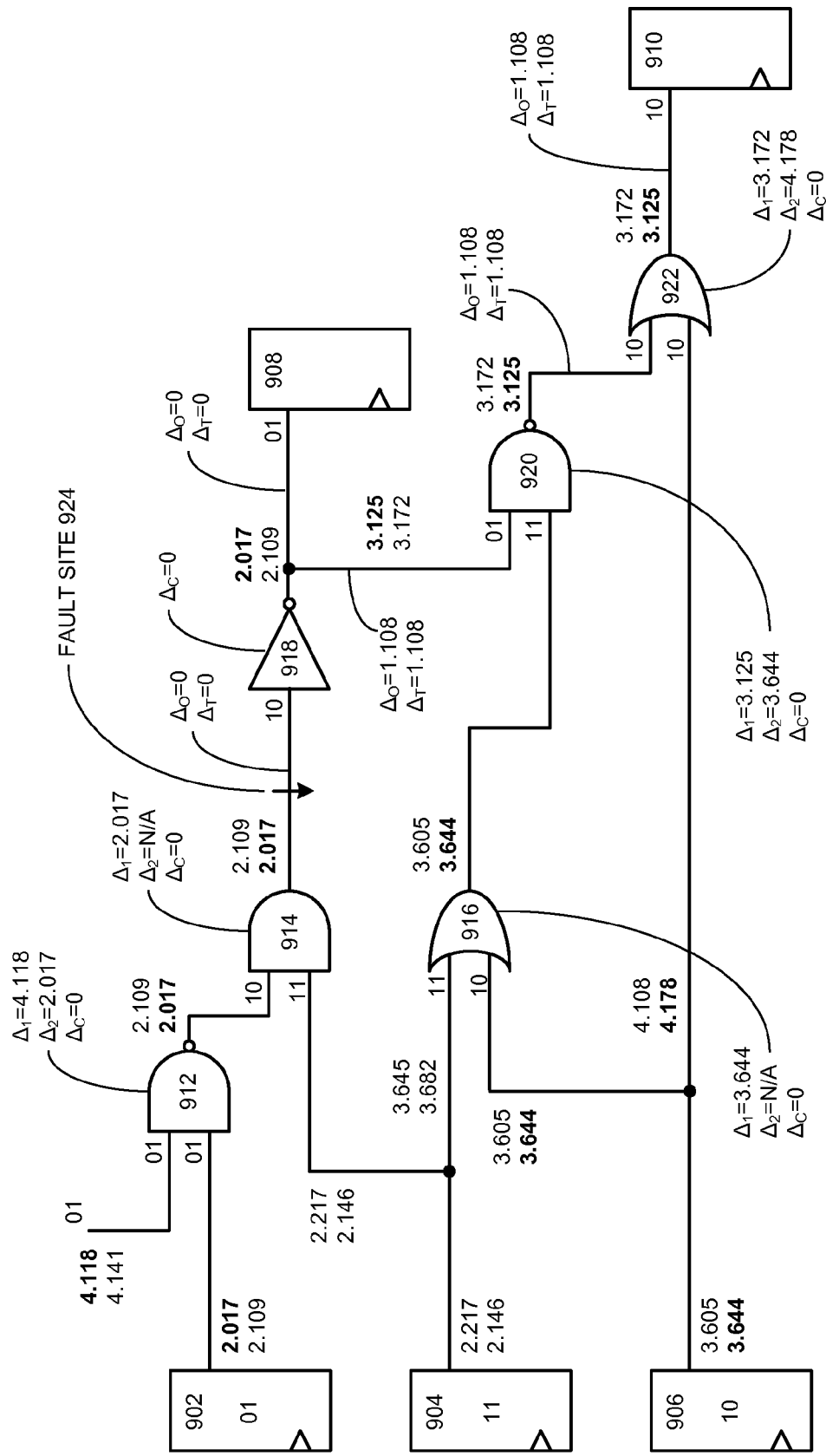
FIG. 9A illustrates the process of calculating delta slacks during fault simulation in accordance with an embodiment of the present invention.

FIG. 9A illustrates the process of calculating delta slacks during fault simulation in accordance with an embodiment of the present invention. It contains flip-flops 902-910, NAND gates 912 and 920, AND gate 914, OR gates 916 and 922, and inverter 918. During fault simulation, test patterns have already been generated by the ATPG engine for the fault at fault site 924 and the fault simulator determines which faults are detected by the test patterns.

Note that outputs of source flip-flops and inputs to the circuit have zero delta slacks. Also note that if a net produces no transitions, a delta slack does not apply (i.e. N/A). The slack numbers used to calculate the delta slacks correspond to the transition being made. For example, a test pattern of 01 is a high-going transition, thus the high-going transition slack time is used. Furthermore, note that in FIGS. 9A and 9B, the corresponding transition for the generated test patterns are noted at the input of each gate.

The process begins at the outputs of source flip-flops and inputs to the circuit. For each gate coupled to these nodes, a delta slack for each input is computed ($\Delta_1$ and $\Delta_2$) and the input with the smallest delta slack is selected. The smallest delta slack at the inputs of the gate indicates which transition at the input of the gate arrives the latest (i.e. the one on the longest path), and thus is the transition at the input of the gate that controls the transition at the output of the gate. Next, a control_delta slack ($\Delta_C$) is computed for the output of the gate using the selected input by summing the existing delta_slack for the selected input with the difference between the slack of the selected input and the smallest slack for the transition at the inputs of the gate. For example, for NAND gate 912, $\Delta_1$=0+4.118=4.118 and $\Delta_2$=0+2.017=2.017. Thus, the bottom input of NAND gate 912 is selected. $\Delta_C$ is then calculated using the slack times for the bottom input of NAND gate 912: $\Delta_C$=0+(2.017−2.017)=0.

From the fault site until a destination flip-flop or an output of the IC is reached, an observe_delta_slack ($\Delta_O$) is computed for each net. The observe_delta_slack is computed by taking the difference between the slack for a given transition for the net and the smallest slack in the output cone for the fault site. In FIG. 9A, the output cone extends from inverter 918 to destination flip-flop 908, and from inverter 918, to NAND gate 920, to OR gate 922, and to destination flip-flop 910. The observe_delta_slack is added to the control_delta_slack for a given net to produce a total delta slack ($\Delta_T$) for the net.

For example, the output of inverter 918 fans out into two paths. The path going to the input of NAND gate 920 has a larger slack than the input to flip-flop 908. Hence, the $\Delta_O$ for the path leading to the input of NAND gate 920 is: $\Delta_O$=3.125−2.017=1.108. The total delta slack for the path is: $\Delta_T$=0+1.108=1.108.

If the total delta slack is less than the user-selected delta slack, the fault is given credit for detection. For example, if the user-selected delta slack is 1, then the transition fault at fault site 924 is detected at destination flip-flop 908, but not destination flip-flop 910.

Figure 9B:
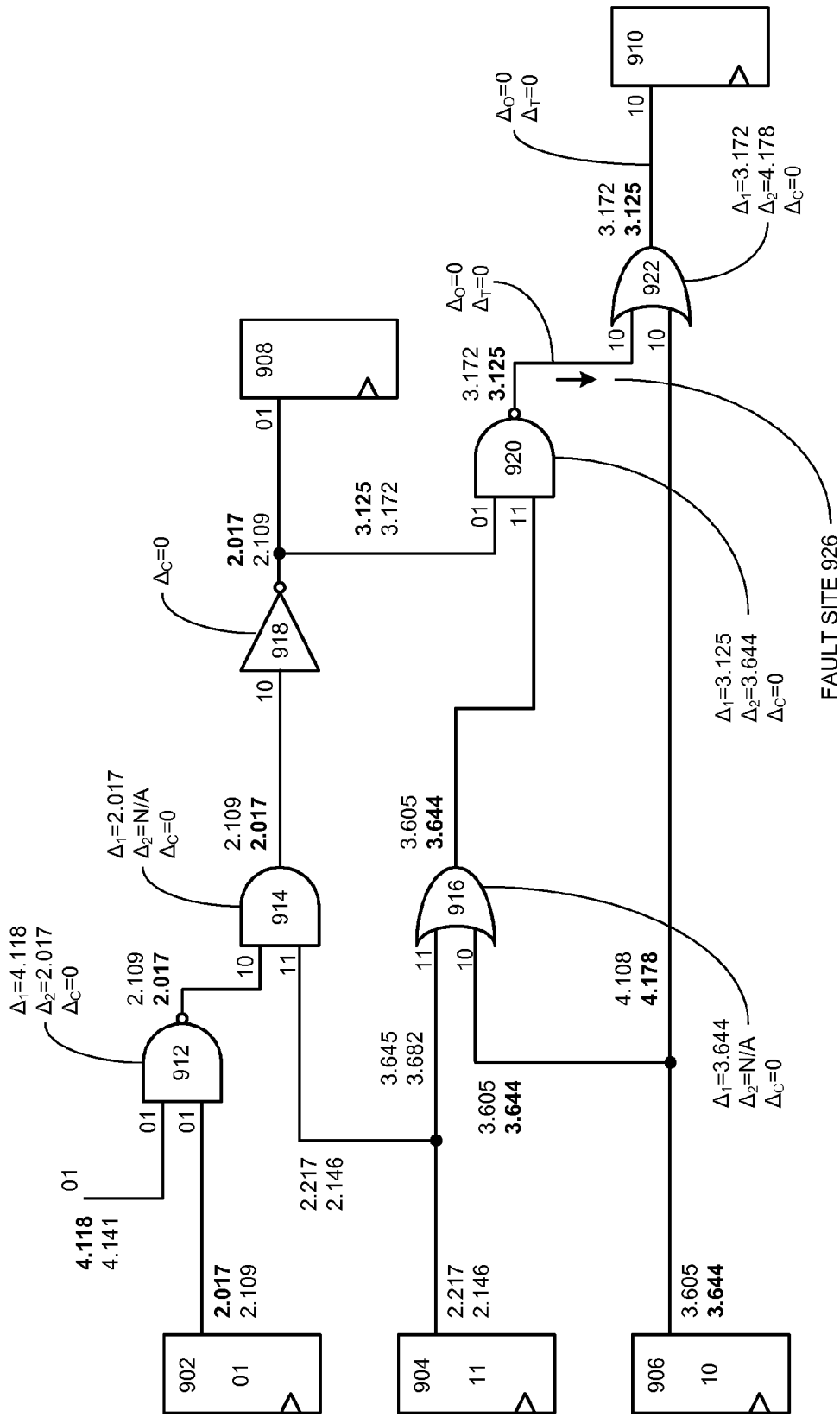
FIG. 9B illustrates the process of calculating delta slacks for a fault which is fortuitously detected during fault simulation in accordance with an embodiment of the present invention.

FIG. 9B illustrates the process of calculating delta slacks for a fault which is fortuitously detected during fault simulation in accordance with an embodiment of the present invention. The computations are analogous to those in FIG. 9A. Note that the observe_delta_slack from fault site 926 onwards is 0 since the output cone for fault site 926 is a single path. In other words, the path from fault site 926 to destination flip-flop 910 is the longest path, therefore $\Delta_O$=3.125−3.125=0 (for both the output of NAND gate 920 and the output of OR gate 922).

Note that the transition fault 926 is fortuitously detected by the test pattern at destination flip-flop 910 with a delta slack of 0.

In one embodiment of the present invention if a test pattern generates a glitch on a given net and if the glitch is above a minimum glitch size, the glitch is treated as a valid transition which can be used to detect a transition fault.

Figure 11A:
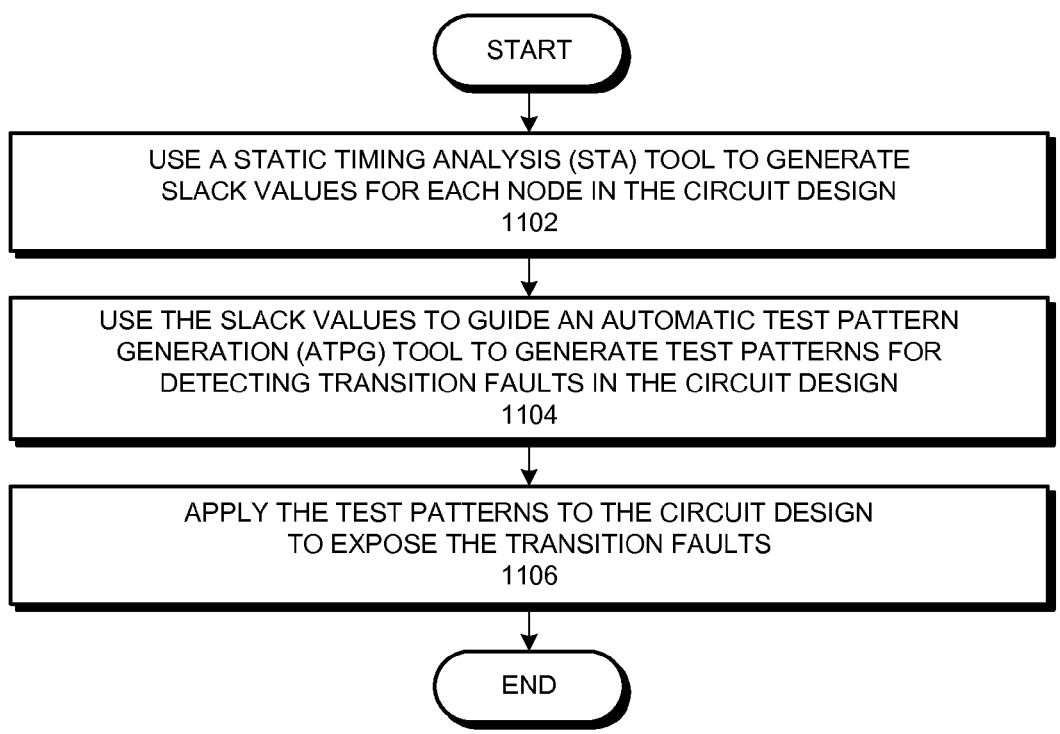
FIG. 11A presents a flow chart illustrating a process for generating test patterns for detecting transition faults in a circuit design in accordance with some embodiments of the present invention.

FIG. 11A presents a flow chart illustrating a process for generating test patterns for detecting transition faults in a circuit design in accordance with some embodiments of the present invention. The system can begin by using a static timing analysis (STA) tool to generate slack values for each node in the circuit design (operation 1102). Then, the system uses the slack values to guide an automatic test pattern generation (ATPG) tool to generate test patterns for detecting transition faults in the circuit design (operation 1104). The system then applies the test patterns to the circuit design to expose the transition faults (operation 1106).

In some embodiments, during operation 1104, the system updates the slack values so that the ATPG tool generates test patterns that propagate a transition along paths that have progressively larger slack values.

Figure 11B:
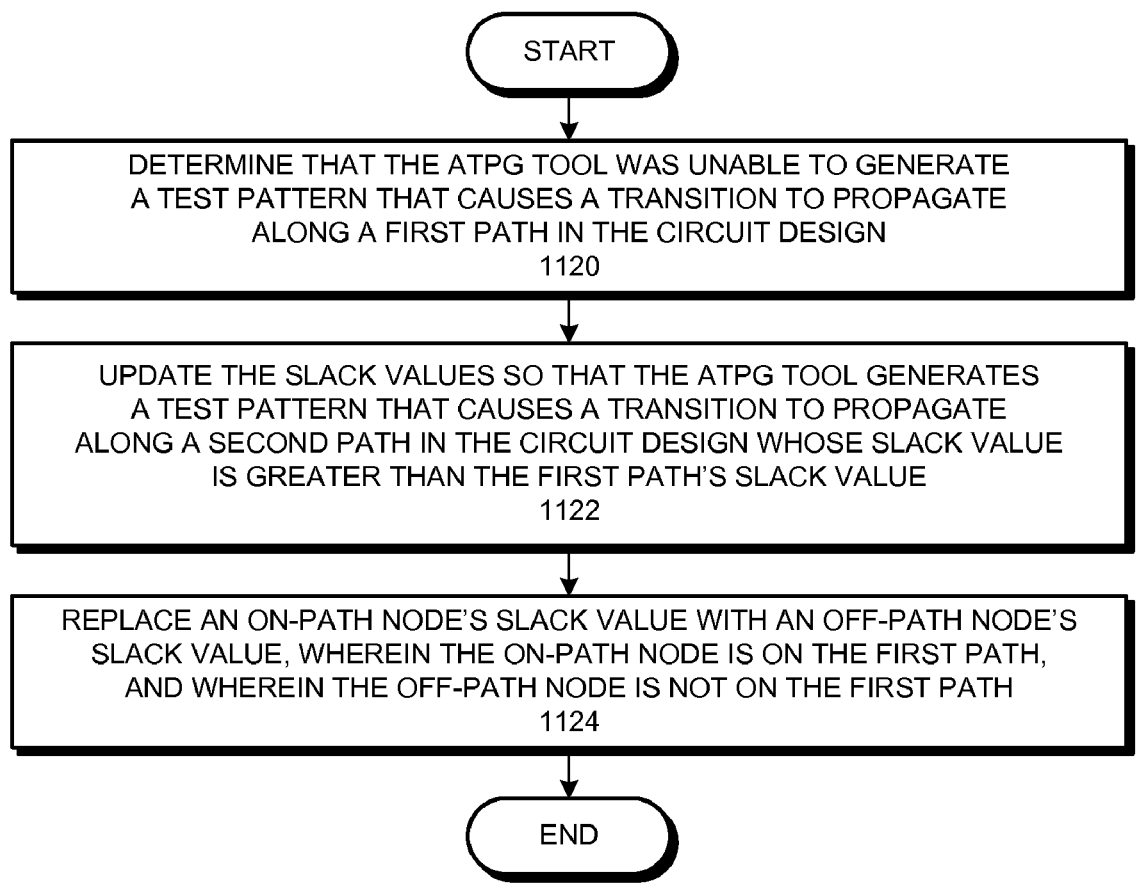
FIG. 11B presents a flow chart illustrating a process for using the slack values to guide an automatic test pattern generation (ATPG) tool in accordance with some embodiments of the present invention.

FIG. 11B presents a flow chart illustrating a process for using the slack values to guide an automatic test pattern generation (ATPG) tool in accordance with some embodiments of the present invention.

The system can begin by determining that the ATPG tool was unable to generate a test pattern that causes a transition to propagate along a first path in the circuit design (operation 1120). Then, in response to operation 1120, the system updates the slack values so that the ATPG tool generates a test pattern that causes a transition to propagate along a second path in the circuit design whose slack value is greater than the first path's slack value (operation 1122). The system then replaces an on-path node's slack value with an off-path node's slack value, wherein the on-path node is on the first path, and wherein the off-path node is not on the first path (operation 1124).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for generating test patterns for detecting transition faults in a circuit design, the method comprising:
    using a static timing analysis (STA) tool to generate per-node slack values for the circuit design, wherein the STA tool at least removes common clock path pessimism from the per-node slack values; and
    using the per-node slack values to guide an automatic test pattern generation (ATPG) tool to generate test patterns for detecting transition faults in the circuit design, which involves modifying the per-node slack values so that the ATPG tool generates test patterns that propagate a transition along paths that have progressively larger slack values.

2. The method of claim 1, wherein guiding the ATPG tool involves: in response to determining that the ATPG tool was unable to generate a test pattern that causes a transition to propagate along a first path in the circuit design, modifying the per-node slack values so that the ATPG tool generates a test pattern that causes a transition to propagate along a second path in the circuit design whose slack value is greater than the first path's slack value.

3. The method of claim 2, wherein modifying the per-node slack values involves replacing an on-path node's slack value with an off-path node's slack value, wherein the on-path node is on the first path, and wherein the off-path node is not on the first path.

4. The method of claim 1, wherein the method further comprises applying the test patterns to the circuit design to expose the transition faults.

5. A computer-readable storage medium storing instructions that when executed by a computer cause the computer to perform a method for generating test patterns for detecting transition faults in a circuit design, the method comprising:
    using a static timing analysis (STA) tool to generate per-node slack values for the circuit design, wherein the STA tool at least removes common clock path pessimism from the per-node slack values; and
    using the per-node slack values to guide an automatic test pattern generation (ATPG) tool to generate test patterns for detecting transition faults in the circuit design, which involves modifying the per-node slack values so that the ATPG tool generates test patterns that propagate a transition along paths that have progressively larger slack values.

6. The computer-readable storage medium of claim 5, wherein guiding the ATPG tool involves: in response to determining that the ATPG tool was unable to generate a test pattern that causes a transition to propagate along a first path in the circuit design, modifying the per-node slack values so that the ATPG tool generates a test pattern that causes a transition to propagate along a second path in the circuit design whose slack value is greater than the first path's slack value.

7. The computer-readable storage medium of claim 6, wherein modifying the per-node slack values involves replacing an on-path node's slack value with an off-path node's slack value, wherein the on-path node is on the first path, and wherein the off-path node is not on the first path.

8. The computer-readable storage medium of claim 5, wherein the method further comprises applying the test patterns to the circuit design to expose the transition faults.

9. A method for generating test patterns for detecting transition faults in a circuit design, the method comprising:
    using a static timing analysis (STA) tool to generate per-node slack values in the circuit design;
    using the per-node slack values to determine slack values for transition faults for which test patterns are desired to be generated;
    receiving a threshold which enables a user to strike a balance between test coverage and test accuracy; and
    generating test patterns using an automatic test pattern generation (ATPG) tool by:
        for transition faults whose slack values are less than the threshold, generating test patterns by guiding the ATPG tool using the per-node slack values, which involves modifying the per-node slack values so that the ATPG tool generates test patterns that propagate a transition along paths that have progressively larger slack values; and
        for transition faults whose slack values are greater than the threshold, generating test patterns without guiding the ATPG tool.

10. The method of claim 9, wherein guiding the ATPG tool involves: in response to determining that the ATPG tool was unable to generate a test pattern that causes a transition to propagate along a first path in the circuit design, modifying the per-node slack values so that the ATPG tool generates a test pattern that causes a transition to propagate along a second path in the circuit design whose slack value is greater than the first path's slack value.

11. The method of claim 10, wherein modifying the per-node slack values involves replacing an on-path node's slack value with an off-path node's slack value, wherein the on-path node is on the first path, and wherein the off-path node is not on the first path.

12. The method of claim 9, wherein the method further comprises applying the test patterns to the circuit design to expose the transition faults.

13. A computer-readable storage medium storing instructions that when executed by a computer cause the computer to perform a method for generating test patterns for detecting transition faults in a circuit design, the method comprising:
    using a static timing analysis (STA) tool to generate per-node slack values in the circuit design;

using the per-node slack values to determine slack values for transition faults for which test patterns are desired to be generated;

receiving a threshold which enables a user to strike a balance between test coverage and test accuracy; and generating test patterns using an automatic test pattern generation (ATPG) tool by:

for transition faults whose slack values are less than the threshold, generating test patterns by guiding the ATPG tool using the per-node slack values, which involves modifying the per-node slack values so that the ATPG tool generates test patterns that propagate a transition along paths that have progressively larger slack values; and for transition faults whose slack values are greater than the threshold, generating test patterns without guiding the ATPG tool.

14. The computer-readable storage medium of claim 13, wherein guiding the ATPG tool involves: in response to determining that the ATPG tool was unable to generate a test pattern that causes a transition to propagate along a first path in the circuit design, modifying the per-node slack values so that the ATPG tool generates a test pattern that causes a transition to propagate along a second path in the circuit design whose slack value is greater than the first path's slack value.

15. The computer-readable storage medium of claim 14, wherein modifying the per-node slack values involves replacing an on-path node's slack value with an off-path node's slack value, wherein the on-path node is on the first path, and wherein the off-path node is not on the first path.

16. The computer-readable storage medium of claim 13, wherein the method further comprises applying the test patterns to the circuit design to expose the transition faults.

* * * * *